(12) United States Patent
Wang

(10) Patent No.: US 11,415,797 B2
(45) Date of Patent: Aug. 16, 2022

(54) EYE TRACKING DEVICE AND ELECTRONIC DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Shih-Yu Wang, Hsinchu (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(*) Notice: Subject to any disclaimer, the term of this patent is extended or adjusted under 35 U.S.C. 154(b) by 59 days.

(21) Appl. No.: 17/014,059

(22) Filed: Sep. 8, 2020

(65) Prior Publication Data
US 2022/0003991 A1 Jan. 6, 2022

(30) Foreign Application Priority Data
Jul. 1, 2020 (CN) .......................... 202010622425.1

(51) Int. Cl.
| G02B 27/00 | (2006.01) |
| G01J 5/00 | (2022.01) |
| H01L 27/146 | (2006.01) |
| H04N 5/33 | (2006.01) |

(52) U.S. Cl.
CPC ........ *G02B 27/0093* (2013.01); *G01J 5/0096* (2013.01); *H01L 27/14665* (2013.01); *H04N 5/33* (2013.01); *G01J 2005/0077* (2013.01)

(58) Field of Classification Search
None
See application file for complete search history.

(56) References Cited

U.S. PATENT DOCUMENTS

| 5,619,373 A * | 4/1997 | Meyerhofer | ....... G02B 27/0037 359/482 |
| 9,880,441 B1 * | 1/2018 | Osterhout | .............. G02B 7/006 |
| 10,698,204 B1 * | 6/2020 | Ouderkirk | .......... G02B 27/0172 |
| 10,845,594 B1 * | 11/2020 | Lam | ...................... G06F 3/0304 |
| 10,923,630 B1 * | 2/2021 | Pynn | .................. H01L 33/0025 |
| 11,073,903 B1 * | 7/2021 | Ouderkirk | .............. G02B 5/208 |

(Continued)

FOREIGN PATENT DOCUMENTS

| AU | 2017310912 B2 * | 7/2020 | ............. G06F 3/013 |
| CN | 102955255 A * | 3/2013 | ............... G02B 5/20 |

(Continued)

*Primary Examiner* — Stefan Gadomski
(74) *Attorney, Agent, or Firm* — ScienBiziP, P.C.

(57) ABSTRACT

An eye tracking device includes a substrate comprising a first substrate portion and a second substrate portion intersecting with the first substrate portion, an infrared light emitting element on the first substrate portion, and an image acquisition element on the second substrate portion. The infrared light emitting element is configured to emit infrared light to a user's eyeball. The image acquisition element and the infrared light emitting element are non-coplanar. The image acquisition element is configured to receive and sense the infrared light reflected by the eyeball for imaging.

10 Claims, 8 Drawing Sheets

(56) References Cited

U.S. PATENT DOCUMENTS

| | | | | |
|---|---|---|---|---|
| 11,150,468 B1* | 10/2021 | Lee | | G03H 1/0248 |
| 11,175,447 B1* | 11/2021 | Pynn | | H01L 33/32 |
| 2015/0153235 A1* | 6/2015 | Minami | | G01J 1/0437 |
| | | | | 359/350 |
| 2016/0223819 A1* | 8/2016 | Liu | | G06F 3/013 |
| 2017/0017299 A1* | 1/2017 | Biedert | | G02B 27/0172 |
| 2018/0227470 A1* | 8/2018 | Ronngren | | G02B 27/0093 |
| 2019/0025588 A1* | 1/2019 | Osterhout | | H04N 5/232 |
| 2019/0025590 A1* | 1/2019 | Haddick | | G02B 27/141 |
| 2019/0041642 A1* | 2/2019 | Haddick | | G02B 27/0172 |
| 2019/0278093 A1* | 9/2019 | Osterhout | | G06T 19/20 |
| 2019/0312186 A1* | 10/2019 | Doyle | | H01L 33/60 |
| 2019/0361523 A1* | 11/2019 | Sharma | | G02B 27/0955 |
| 2020/0183155 A1* | 6/2020 | Xie | | G02B 26/0816 |
| 2020/0218348 A1* | 7/2020 | Eash | | G02B 27/0172 |
| 2020/0400962 A1* | 12/2020 | Hirano | | G02C 11/06 |
| 2021/0055555 A1* | 2/2021 | Chi | | G02B 27/4205 |
| 2021/0111319 A1* | 4/2021 | Lutgen | | G02B 27/0972 |
| 2021/0126164 A1* | 4/2021 | Broell | | H01L 25/0753 |
| 2021/0151649 A1* | 5/2021 | Goward | | H01L 27/156 |
| 2021/0157142 A1* | 5/2021 | Scheller | | G02B 6/0016 |
| 2021/0159373 A1* | 5/2021 | Grundmann | | H01L 33/24 |
| 2021/0165318 A1* | 6/2021 | Pendse | | G02B 6/32 |
| 2021/0175216 A1* | 6/2021 | Pendse | | H01L 24/80 |
| 2021/0191180 A1* | 6/2021 | Malhotra | | C08L 67/00 |
| 2021/0199873 A1* | 7/2021 | Shi | | G02B 6/0031 |
| 2021/0199971 A1* | 7/2021 | Lee | | G02B 27/0172 |
| 2021/0201769 A1* | 7/2021 | Morris | | H01L 25/0753 |
| 2021/0375048 A1* | 12/2021 | Kang | | G02B 27/0093 |
| 2021/0376194 A1* | 12/2021 | Hahn | | H01L 33/24 |
| 2021/0382325 A1* | 12/2021 | Kubota | | A61B 3/0008 |

FOREIGN PATENT DOCUMENTS

| | | | | |
|---|---|---|---|---|
| CN | 104090659 A | * | 10/2014 | |
| CN | 104204904 A | * | 12/2014 | G02B 27/0172 |
| CN | 106464861 B | * | 5/2018 | G02B 30/27 |
| CN | 110568623 A | * | 12/2019 | |
| CN | 108352075 B | * | 1/2020 | G06F 3/013 |
| CN | 110989166 A | * | 4/2020 | |
| EP | 2499964 A1 | * | 9/2012 | G02B 27/017 |
| EP | 3582077 A1 | * | 12/2019 | G02C 11/10 |
| WO | WO-2019040736 A1 | * | 2/2019 | G06F 3/011 |
| WO | WO-2019104413 A1 | * | 6/2019 | G02B 27/0176 |

* cited by examiner

EYE TRACKING DEVICE AND ELECTRONIC DEVICE USING SAME

FIELD

The subject matter herein generally relates to an eye tracking device and an electronic device using the eye tracking device.

BACKGROUND

The human eye allows human beings to obtain information from the surrounding world. Accurate measurement of the direction of gaze of a person's eyes can provide an important basis for studying human psychological activities and extracting psychological consciousness. The direction of gaze of eyes can replace mouse or touch operations to realize human-computer interaction. Eye movement tracking is a scientific and applied technology. When people's eyes look in different directions, there are subtle changes in the eyes. These changes can be tracked and the features of the changes can be extracted. These changes can be extracted by image capture or scanning, so as to track the eyes in real time, predict the states and needs of users, and achieve the purpose of controlling equipment with eyes, as the direction of gaze can be recognized and responded to. For example, users can flip the page by eye movement without touching the screen, or control video playing by eye movement, the video player will automatically pause when the user moves his or her gaze until the eyes return to the screen.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
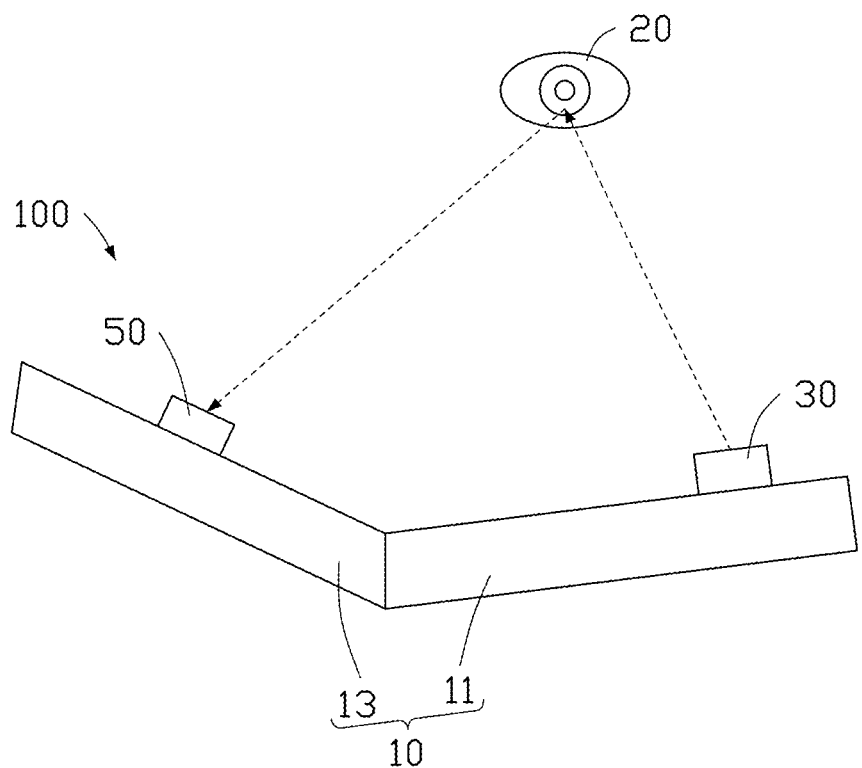
FIG. 1 is a schematic view of an eye tracking device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

FIG. 1 illustrates an eye tracking device 100 of an embodiment. The eye tracking device 100 includes a substrate 10, and an infrared light emitting element 30 and an image acquisition element 50 both on the substrate 10. The substrate 10 includes a first substrate portion 11 and a second substrate portion 13 intersecting with the first substrate portion 11. The first substrate portion 11 and the second substrate portion 13 are both approximately tabular. In this embodiment, the first substrate portion 11 and the second substrate portion 13 are connected as a whole.

As shown in FIG. 1, the infrared light emitting element 30 is located on the first substrate portion 11 to emit infrared light towards the user's eyeball 20. The infrared light emitted by infrared light emitting element 30 is near-infrared light having a wavelength of 780 nm to 1100 nm. Near-infrared light is effectively invisible to human eyes, so sending infrared light to users' eyes will not distract users' attention.

As shown in FIG. 1, the image acquisition element 50 is located on the second substrate portion 13, and the image acquisition element 50 and the infrared light emitting element 30 are located on a same side of the substrate 10, so the image acquisition element 50 and the infrared light emitting element 30 are not located on a same plane. The image acquisition element 50 and the infrared light emitting element 30 are not coplanar. The image acquisition element 50 is used to receive and sense the infrared light reflected by the eyeball 20. The change of eye gaze direction or pupil position can be extracted according to the reflection of the infrared light. The infrared light emitting element 30 and image acquisition element 50 are not planar, so to increase the irradiating quality of infrared light-emitting element 30, making the image clearer and effectively improving the accuracy of eye movement tracking.

Figure 2:
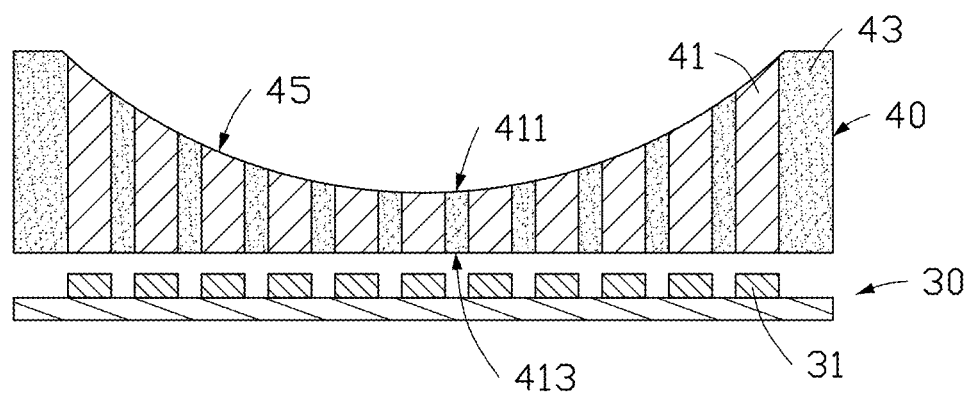
FIG. 2 is a cross-sectional view of an infrared light-emitting element and a photoconductive layer.

As shown in FIG. 2, the infrared light emitting element 30 includes a plurality of miniature light emitting diodes (micro-LEDs) 31 for emitting near-infrared light. The micro LEDs 31 are located on a same horizontal plane. The micro LEDs 31 can be a matrix arrangement or other shape arrangement. A light emitting side of the micro LEDs 31 is provided with a photoconductive layer 40. The photoconductive layer 40 adjusts uniformity and brightness of the infrared light emitted from the micro LEDs 31, to ensure even distribution and appropriate brightness of the infrared light.

Figure 3:
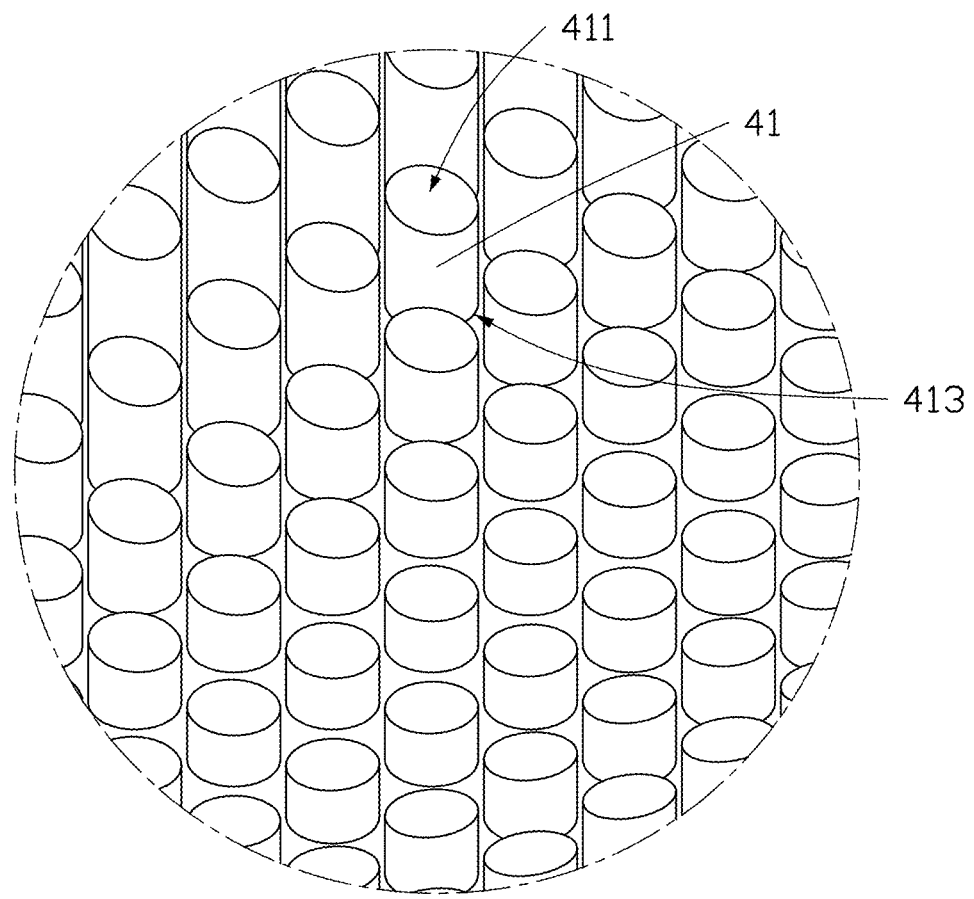
FIG. 3 is a partial view of microprisms in the photoconductive layer of FIG. 2.

In one embodiment, as shown in FIG. 2, the photoconductive layer 40 includes a plurality of microprisms 41 spaced apart from each other. The microprisms 41 are configured to allow the infrared light emitted from the micro LEDs 31 to pass through. Each micro prism 41 is columnar. The photoconductive layer 40 also includes light absorbing material 43 filled in between the microprisms 41. A surface 45 of the photoconductive layer 40 away from the plurality of micro LEDs 31 is a concave spherical surface, being concave in a direction of the micro LEDs 31. The microprisms 41 have heights which gradually increase from a center to an edge of the photoconductive layer 40. As shown in FIG. 3, each micro prism 41 has a first end surface 411 away from the micro LEDs 31 and a second end surface 413 adjacent to the micro LEDs 31. The first end surface 411 and the second end surface 413 are opposite to each other. The second end surface 413 is a plane surface, and the second end surface 413 is an arcing surface intersecting with the first end surface 411.

The light absorbing material 43 is conventional in the art, such as that for absorbing light having a wavelength of about 400 nm to about 700 nm in the entire visible light region, including a region commonly used for chemiluminescence (a wavelength of about 460 nm).

Figure 4:
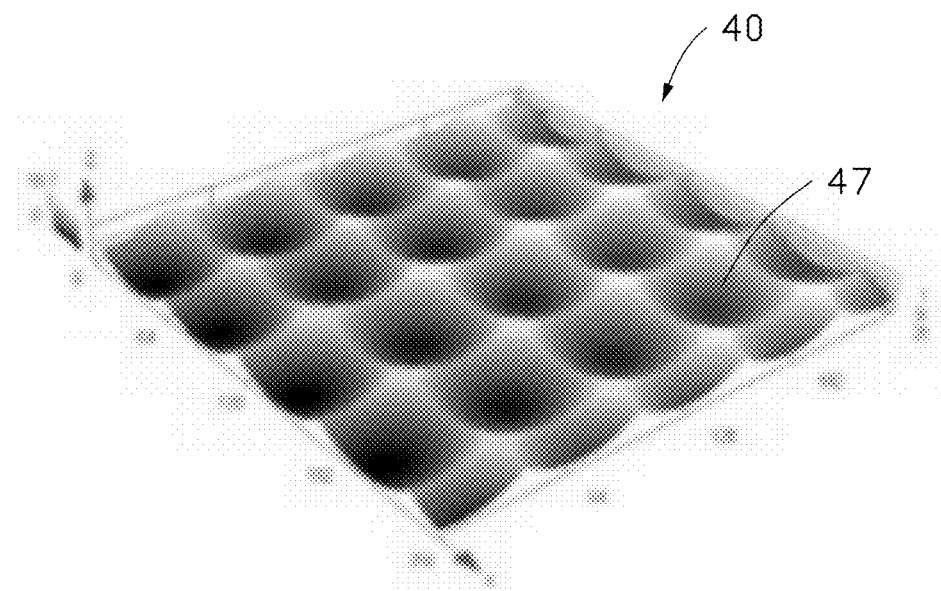
FIG. 4 is a schematic view of a photoconductive layer of another embodiment.
Figure 5:
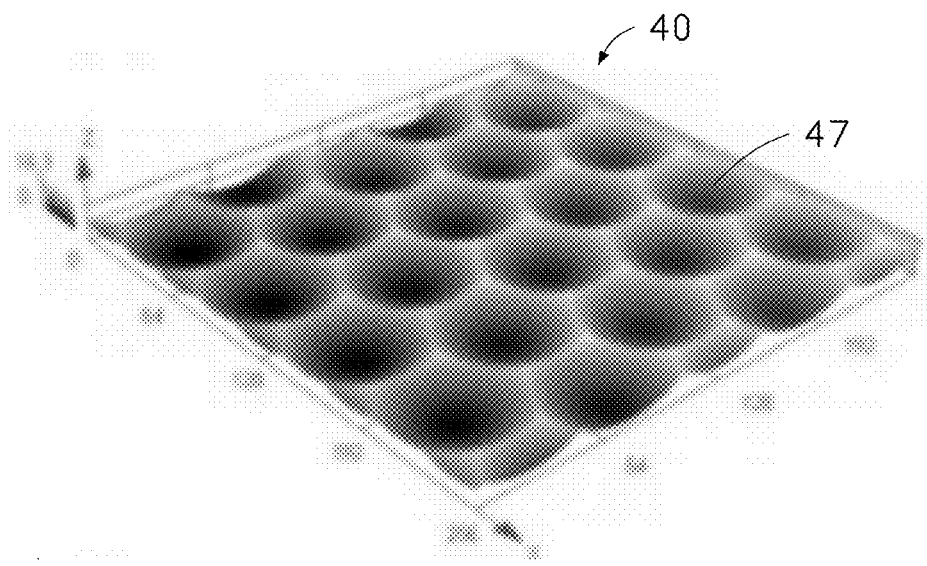
FIG. 5 is a schematic view of a photoconductive layer of another embodiment.

In another embodiment, as shown in FIG. 4 and FIG. 5, the surface of the photoconductive layer 40 away from the plurality of micro LEDs 31 forms a plurality of micro-recesses 47 that concaves toward the plurality of micro LEDs 31, and each micro-recess 47 is concave. In the present embodiment, the micro-recesses 47 are arranged adjacent to each other one by one. FIG. 3 and FIG. 4 only show a shape of the surface the photoconductive layer 40 away from the micro LEDs 31. In fact, the photoconductive layer 40 in each of FIG. 3 and FIG. 4 also includes a plurality of microprisms 41 spaced apart from each other and light absorbing material 43 infilled between the microprisms 41. As shown in FIG. 3, an opening of each micro-recess 47 is approximately quadrilateral as shown in FIG. 4, and the opening of each micro-recess 47 is approximately hexagonal. A shape of the opening of the micro-recess 47 is not limited to being quadrilateral and hexagonal and can also be adjusted as required. The opening size and depth of the micro-recess 47 can also be adjusted as required.

Figure 6:
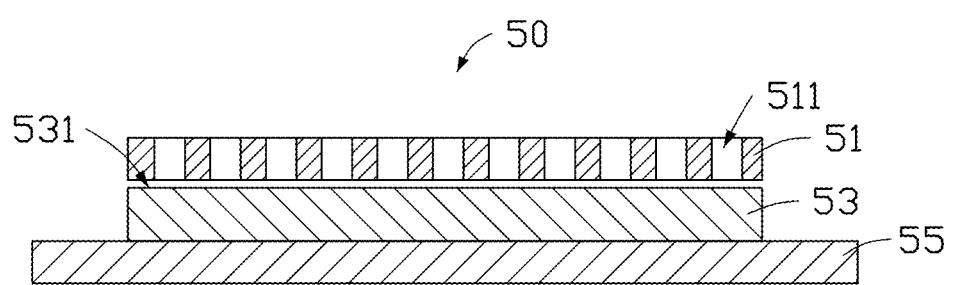
FIG. 6 is a cross-sectional view of an image acquisition element.

As shown in FIG. 6, the image acquisition element 50 includes a mask 51 and an image sensor 53 opposite to and spaced apart from the mask 51. In one embodiment, a distance between the mask 51 and the image sensor 53 is 0.2 mm. A plurality of through holes 511 is defined in the mask 51. The through holes 511 are spaced apart from each other. The mask 51 is opaque, and the through holes 511 allow the infrared light reflected from the eyeball to pass through the mask 51. The mask 51 may be made of opaque material, or the mask 51 may include a transparent substrate 10 (not shown) and an opaque photoresist layer (not shown) attached to the transparent substrate 10. The image sensor 53 receives infrared light transmitted from the through holes 511 and perform imaging. The light reflected by the eyeball 20 passes through the through holes 511 for pinhole imaging and is received by the image sensor 53. In one embodiment, the through holes 511 of the mask 51 are arranged in a matrix of multiple rows and columns.

The image sensor 53 may be a CMOS image sensor known in the art. The image sensor 53 utilizes the photoelectric conversion function of photoelectric devices. The image sensor 53 has a photosensitive surface 531 configured to receive the reflected light. The photosensitive surface 531 is divided into a plurality of imaging units (referred to as pixels) and converts the optical signal of the imaging unit into electrical signals proportional to the optical signals. In the present embodiment, the photosensitive surface 531 faces the mask 51.

As shown in FIG. 6, a side of the image sensor 53 away from the mask 51 is also provided with a circuit board 55. The circuit board 55 is electrically connected to the image sensor 53. The image sensor 53 transmits image data to the circuit board 55 for subsequent data processing. In one embodiment, the circuit board 55 is the substrate 10. That is, the image sensor 53 and the infrared light emitting element 30 are directly arranged on the circuit board 55 and are electrically connected to the circuit board 55, the circuit board 55 includes two intersecting parts that are the first substrate portion 11 and the second substrate portion 13. For example, an image data processing module (not shown) can be set on or electrically connected to the circuit board 55, and the image data processing module applies the algorithm for the whole eye tracking device.

Figure 7:
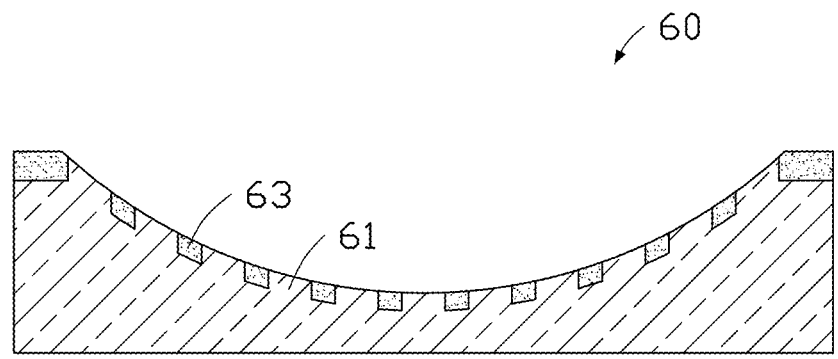
FIG. 7 is a cross-sectional view of another embodiment of the photoconductive layer.

The photoconductive layer 40 in FIG. 2 can also be replaced by the photoconductive layer 60 shown in FIG. 7. As shown in FIG. 7, the photoconductive layer 60 includes a transparent base layer 61 and a light shielding layer 63 stacked on the transparent base layer 61. The light shielding layer 63 partially covers the transparent base layer 61. The light shielding layer 63 is made of a material that cannot be penetrated by light. In this way, the infrared light emitted from the micro LEDs 31 can pass through an area on the surface of the transparent base layer 61 that is not covered by the light shielding layer 63.

It can be understood that the transparent base layer 61 of the photoconductive layer 60 can also be made of material allowing infrared light to pass through, such as an IR pass filter, to let the infrared light pass through. The IR pass filter can reflect visible light while allowing infrared light or emission from other heat sources to pass through.

Figure 8:
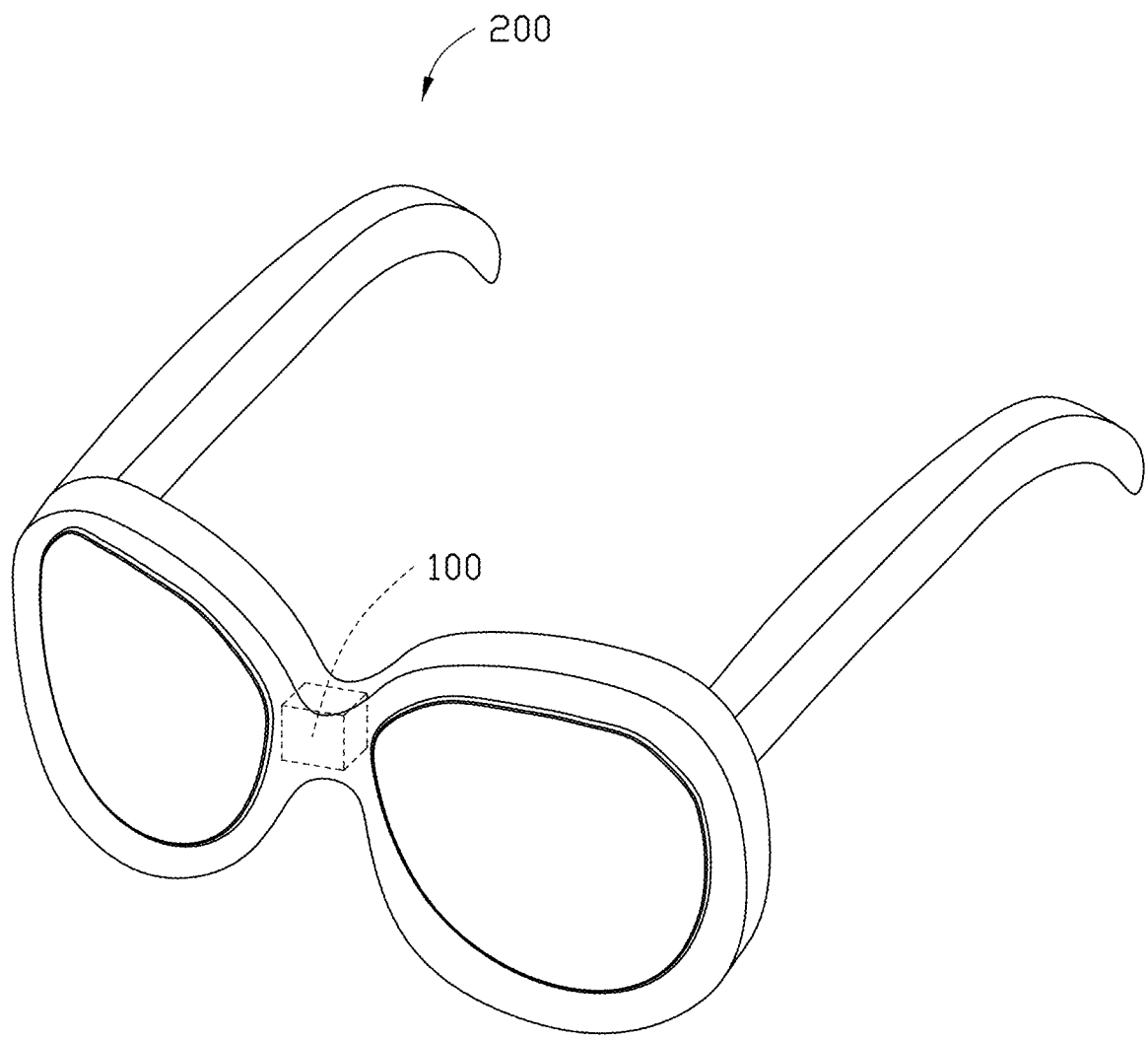
FIG. 8 is an isometric view of an electronic device using the eye tracking device.

FIG. 8 illustrates an electronic device 200 using the eye tracking device 100. The electronic device 200 is a wearable electronic device. In this embodiment, the electronic device 200 is spectacles. The eye tracking device 100 can be arranged on a nose pad or a frame of the spectacles without affecting user vision. The electronic device 200 realizes non-contact control by the eye tracking device 100.

Light irradiation by the infrared light emitting element 30 can be increased by a non-coplanar arrangement of the image acquisition element 50 and the infrared light-emitting element 30, so as to make clearer images for processing, thus effectively improving the accuracy of eye movement tracking. In addition, the infrared light emitting element 30 is also equipped with a photoconductive layer 40, so as to make light emitted from the micro LEDs 3 uniform and of appropriate brightness.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An eye tracking device, comprising:
   a substrate, the substrate comprising a first substrate portion and a second substrate portion intersecting with the first substrate portion;
   an infrared light emitting element on the first substrate portion, the infrared light emitting element configured to emit infrared light to a user's eyeball; and
   an image acquisition element on the second substrate portion, wherein the image acquisition element and the infrared light emitting element are non-coplanar; the image acquisition element is configured to receive and sense the infrared light reflected by the eyeball for imaging;

wherein the infrared light emitting element comprises a plurality of micro-LEDs for emitting near-infrared light;

wherein a light emitting side of the plurality of micro LEDs is provided with a photoconductive layer;

wherein the photoconductive layer comprises a plurality of microprisms spaced apart from each other; each of the plurality of microprisms is columnar;

wherein the photoconductive layer further comprises light absorbing material filled between the plurality of microprisms;

wherein a surface of the photoconductive layer away from the plurality of micro LEDs is a concave spherical surface concave toward the plurality of micro LEDs; the plurality of microprisms have heights gradually increase from a center to an edge of the photoconductive layer.

2. The eye tracking device of claim 1, wherein the photoconductive layer comprises a base layer and a light shielding layer; the light shielding layer partially covers the base layer; the base layer is made of light transmitting material or an infrared light transmitting material.

3. The eye tracking device of claim 1, wherein the image acquisition element comprises a mask and an image sensor opposite to and spaced apart from the mask; a plurality of through holes is defined in the mask to allow light to pass through the mask to the image sensor.

4. The eye tracking device of claim 3, wherein a side of the image sensor away from the mask is provided with a circuit board; the circuit board is electrically connected to the image sensor.

5. The eye tracking device of claim 3, wherein the substrate is a circuit board; both the image sensor and the infrared light emitting element are located on and electrically coupled to the circuit board.

6. An electronic device, comprising:
a frame; and
an eye tracking device on the frame, the eye tracking device comprising:
a substrate, the substrate comprising a first substrate portion and a second substrate portion intersecting with the first substrate portion;
an infrared light emitting element on the first substrate portion, the infrared light emitting element configured to emit infrared light to a user's eyeball; and
an image acquisition element on the second substrate portion, wherein the image acquisition element and the infrared light emitting element are non-coplanar; the image acquisition element is configured to receive and sense the infrared light reflected by the eyeball for imaging;

wherein the infrared light emitting element comprises a plurality of micro-LEDs for emitting near-infrared light;

wherein a light emitting side of the plurality of micro LEDs is provided with a photoconductive layer; the photoconductive layer comprises a plurality of microprisms spaced apart from each other and light absorbing material filled between the plurality of microprisms; each of the plurality of microprisms is columnar;

wherein a surface of the photoconductive layer away from the plurality of micro LEDs is a concave spherical surface concave toward the plurality of micro LEDs; the plurality of microprisms have heights gradually increase from a center to an edge of the photoconductive layer.

7. The electronic device of claim 6, wherein photoconductive layer comprises a base layer and a light shielding layer; the light shielding layer partially covers the base layer; the base layer is made of light transmitting material or an infrared light transmitting material.

8. The electronic device of claim 6, wherein the image acquisition element comprises a mask and an image sensor opposite to and spaced apart from the mask; a plurality of through holes is defined in the mask to allow light to pass through the mask to the image sensor.

9. The electronic device of claim 8, wherein a side of the image sensor away from the mask is provided with a circuit board; the circuit board is electrically connected to the image sensor.

10. The electronic device of claim 8, wherein the substrate is a circuit board; both the image sensor and the infrared light emitting element are located on and electrically coupled to the circuit board.

* * * * *